(12) United States Patent  (10) Patent No.: US 6,556,442 B2
Lin  (45) Date of Patent: Apr. 29, 2003

(54) CPU COOLING STRUCTURE

(75) Inventor: Shih-Jen Lin, Taipei (TW)

(73) Assignee: Global WIN Technology Co. Ltd., Taipei (TW)

( * ) Notice: Subject to any disclaimer, the term of this patent is extended or adjusted under 35 U.S.C. 154(b) by 0 days.

(21) Appl. No.: 10/073,199

(22) Filed: Feb. 13, 2002

(65) Prior Publication Data

US 2002/0191375 A1 Dec. 19, 2002

(30) Foreign Application Priority Data

Jun. 19, 2001 (TW) .................................... 90210328 U

(51) Int. Cl.⁷ ................................................ H05K 7/20
(52) U.S. Cl. ...................... 361/697; 24/458; 248/510; 257/718; 361/719
(58) Field of Search ...................... 24/295, 453, 457, 24/458; 248/316.7, 505, 510; 257/718, 719, 722, 726, 727; 174/16.3; 165/80.3, 185, 121–126; 454/184; 415/177, 178, 213.1, 214.1; 361/687, 695, 697, 704, 709–712, 717–719

(56) References Cited

U.S. PATENT DOCUMENTS 5,784,257 A * 7/1998 Tata ............................ 361/704
5,932,925 A * 8/1999 McIntyre .................... 257/719
6,462,945 B2 * 10/2002 Sloan et al. ................. 361/687
6,496,368 B2 * 12/2002 Jui-Yuan ..................... 361/697

* cited by examiner

Primary Examiner—Gerald Tolin
(74) Attorney, Agent, or Firm—Bacon & Thomas, PLLC

(57) ABSTRACT

A CPU cooling structure is constructed to include a CPU holder holding a CPU, a heat sink mounted on the CPU holder in contact with the CPU, two fans at two sides of the heat sink, and a narrow elongated, substantially ⊓-shaped heat sink fastener bridged the heat sink and hooked on front and back hooks of the CPU holder to secure the heat sink in position, the heat sink fastener having a top center screw hole fastened to a top center locating hole of the heat sink by a hand screw, and two coupling end pieces respectively extended from the ends of two arms thereof and hooked on the hooks of the CPU holder.

3 Claims, 5 Drawing Sheets

CPU COOLING STRUCTURE

BACKGROUND OF THE INVENTION

1. Field of the Invention

The present invention relates to a CPU cooling structure and, more particularly, to such a CPU cooling structure in which a narrow elongated, substantially ⊓-shaped heat sink fastener is mounted over the heat sink and hooked on front and back hooks of the CPU holder to secure the heat sink and the CPU holder firmly together.

2. Description of the Related Art

Conventionally, the CPU of a computer is directly soldered to the respective circuit of the motherboard. If the CPU damaged, it is difficult to replace the CPU. Further, when using a soldering iron or the like to solder the CPU to the circuit of the motherboard, the CPU tends to be damaged accidentally by the heat of the soldering tool. Nowadays, various CPU holder or adapter means have been disclosed for holding a CPU on a motherboard. However, because the pins of a CPU are slightly obliquely extended downwards, the pins tend to be curved or broken during the installation of the CPU in a CPU holder. New designs of CPU holders commonly have the features that low insertion force is produced when inserting the pins of the CPU into the respective contact holes of the CPU holder and, high resisting force is produced when pulling the pins of the CPU from the respective contact holes of the CPU holder. Further, advances computers provide strong functions and a high operation speed. However, during the operation of the CPU of an advanced computer, much heat is produced. In order to quickly dissipate heat from the CPU, a high performance CPU cooling structure shall be used. FIG. 6 shows a heat sink fastener adapted for securing a heat sink to a CPU holder according to the prior art. This structure of heat sink fastener comprises a narrow, elongated, flat base curved inwards from the ends toward the center, a hook arm extended from one end of the flat base, and a locking lever pivoted to the other end of the flat base. When in use, the flat base is mounted in the heat sink and pressed on the top surface of the flat bottom panel of the heat sink with the hook arm hooked on a hook at one side of the CPU holder, and then the locking lever is turned downwards and hooked on a hook at an opposite side of the CPU holder. This structure of heat sink fastener is still not satisfactory in function. During movement of the computer, the heat sink fastener cannot prohibit the heat sink from a sideways displacement relative to the CPU holder. Further, because the heat sink fastener is of a two-pieces design, its manufacturing process is complicated, and the related precision control is also difficult.

SUMMARY OF THE INVENTION

The present invention has been accomplished to provide a CPU cooling structure, which eliminates the aforesaid drawbacks. It is one object of the present invention to provide a heat sink fastener for a CPU cooling structure, which is easy and inexpensive to manufacture. It is another object of the present invention to provide a heat sink fastener for a CPU cooling structure, which positively secures the heat sink and the CPU holder together when installed, preventing the heat sink from a sideways displacement relative to the CPU holder during delivery of the computer. To achieve these and other objects of the present invention, the CPU cooling structure is comprised of a CPU holder holding a CPU, a heat sink mounted on the CPU holder in contact with the CPU, two fans at two sides of the heat sink and a narrow elongated, substantially ⊓-shaped heat sink fastener bridged the heat sink and hooked on front and back hooks of the CPU holder to secure the heat sink in position. The heat sink has a locating hole at the center of the topside. The heat sink fastener has a top center screw hole fastened to the locating hole of the heat sink by a screw, and two coupling end pieces respectively extended from the ends of two arms thereof and hooked on respective hooks of the CPU holder. Because the heat sink fastener is of a single piece design, it is easy and inexpensive to manufacture.

DETAILED DESCRIPTION OF THE PREFERRED EMBODIMENT

Figure 1:
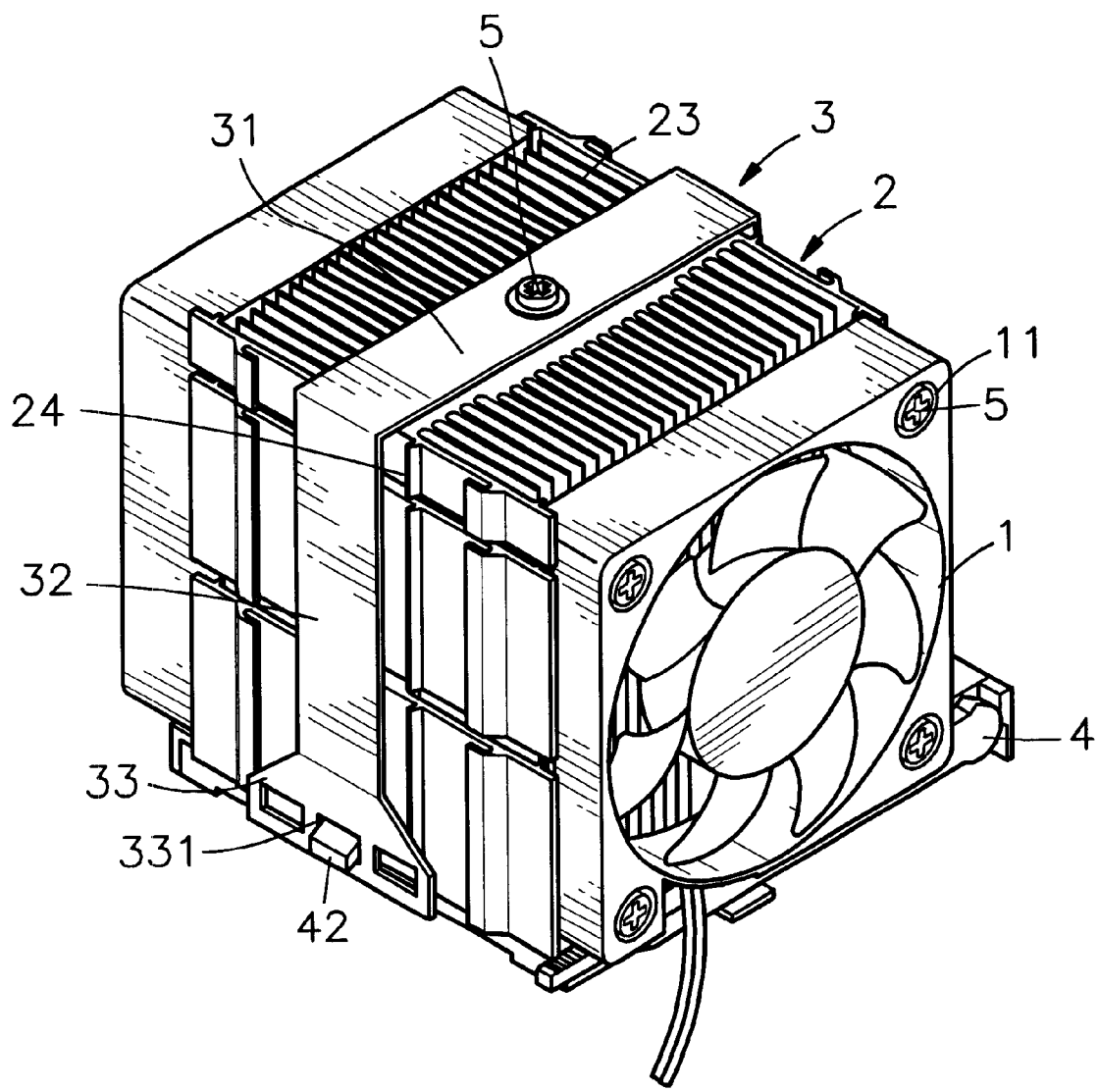
FIG. 1 is a perspective view of a CPU cooling structure according to the present invention.
Figure 2:
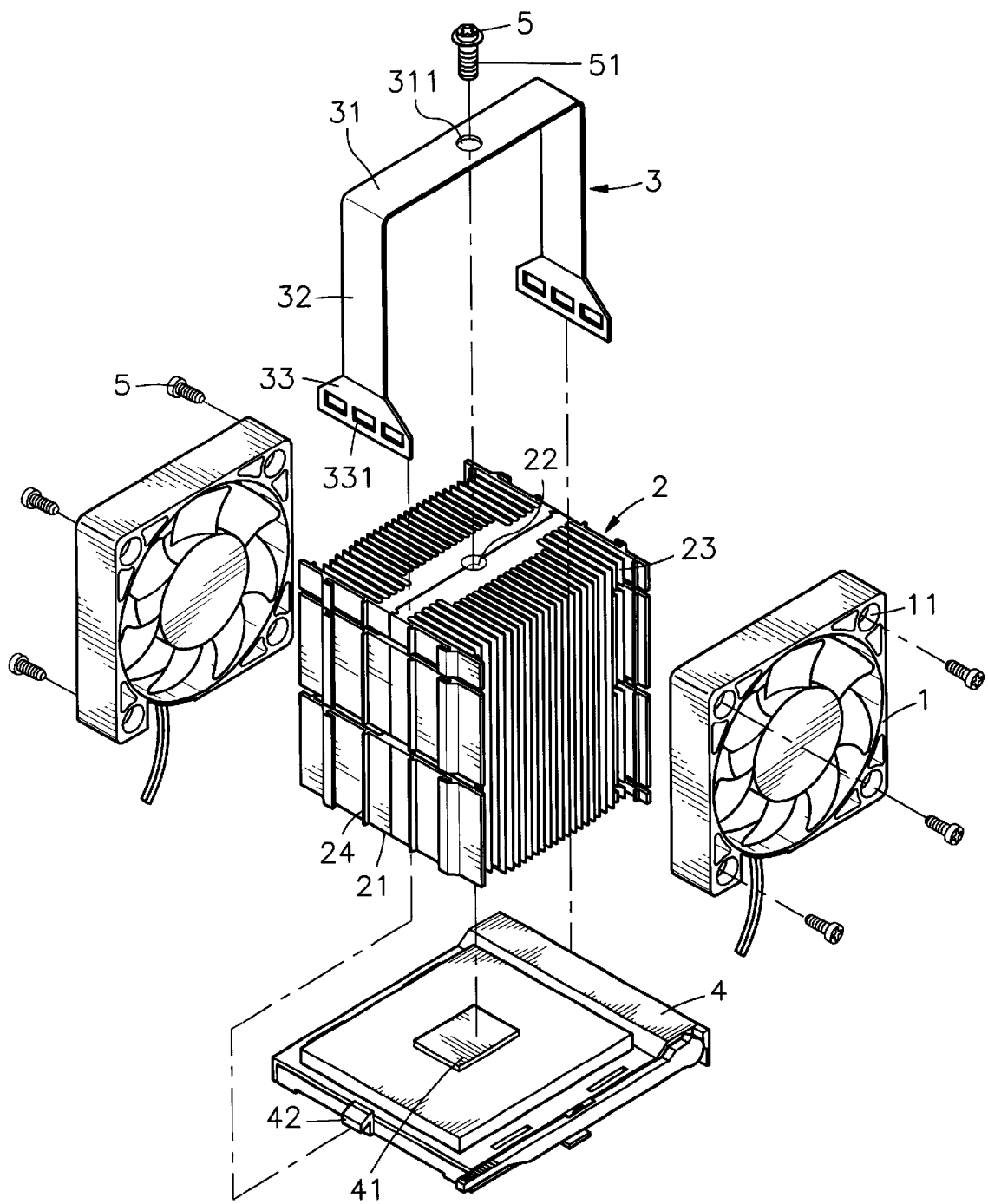
FIG. 2 is an exploded view of the CPU cooling structure according to the present invention.

Referring to FIGS. 1 and 2, a CPU cooling structure is shown comprised of fans 1, a heat sink 2, a heat sink fastener 3, and a CPU holder 4.

The fans 1 each have a plurality of mounting holes 11 respectively disposed in the four corners.

The heat sink 2 has a flat bottom contact face 21, a locating hole 22 at the center of the top side thereof, multiple radiation fins 23 symmetrically extended outwards at two opposite lateral sides, and two pairs of parallel ribs 24 respectively vertically disposed at the front and back side walls thereof.

The heat sink fastener 3 comprises a narrow, horizontally extended, flat base 31, two arms 32 perpendicularly downwardly extended from the two distal ends of the flat base 31, and two coupling end pieces 33 respectively extended from the ends of the arms 32 remote from the flat base 31. The flat base 31 has a center screw hole 311. The coupling end pieces 33 each have a plurality of retaining holes 331.

The CPU holder 4 is adapted to hold a CPU 41 on a motherboard (not shown), having two hooks 42 respectively disposed at the front and backsides.

Figure 3:
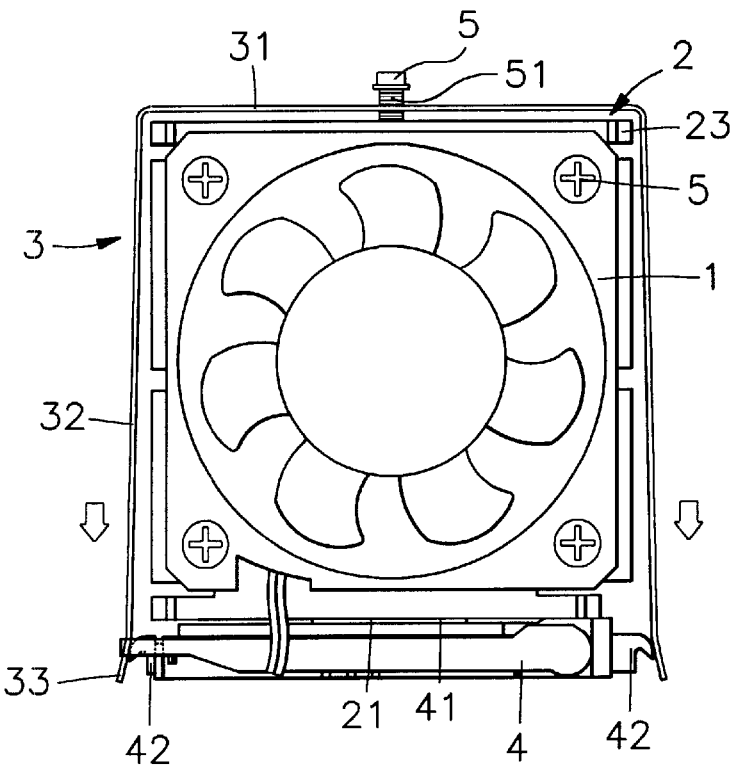
FIG. 3 is a schematic front view showing the installation of the heat sink fastener.

Referring to FIG. 3 and FIG. 2 again, screws 5 are respectively mounted in the mounting holes 11 of the fans 1 and threaded into gaps in between the radiation fins 23 to fixedly secure the fans 1 to the two opposite lateral sides of the heat sink 2. After installation of the fans 1 in the heat sink 2, the heat sink 2 is attached to the CPU holder 4, keeping the flat bottom contact face 21 in close contact with the top sidewall of the CPU 41 in the CPU holder 4, and then the substantially ⊓-shaped heat sink fastener 3 is attached to the heat sink 2, keeping the screw hole 311 of the heat sink fastener 3 in alignment with the locating hole 22 of the heat sink 2 and the arms 32 respectively stopped between the respective pairs of parallel ribs 24 at the front and back sides of the heat sink 2, and then one retaining hole 331 of each of the coupling end pieces 33 is respectively forced into engagement with the hooks 42 of the CPU holder 4 respectively, and then a screw 5 is threaded into the center screw hole 311 of the heat sink fastener 3 and the locating hole 22 of the heat sink 2 to fixedly secure the heat sink fastener 3 in place.

Figure 4:
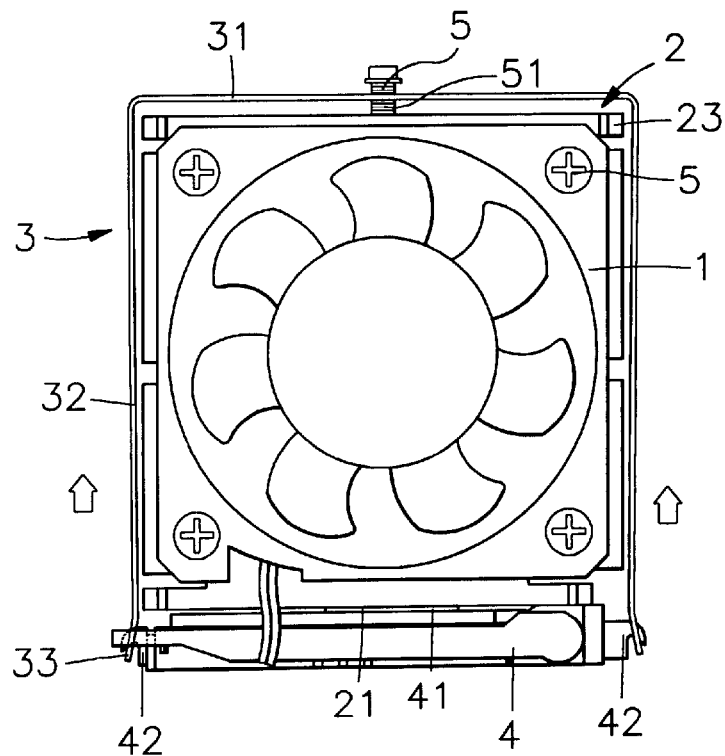
FIG. 4 is similar to FIG. 3 but showing the heat sink fastener installed.

Referring to FIG. 4 and FIGS. 2 and 3 again, the invention uses the heat sink fastener 3 to secure the heat sink 2 and the CPU holder 4 together. When installed, the heat sink fastener 3 bridges the heat sink 2 with the retaining holes 331 of the coupling end pieces 33 hooked on the hooks 42 of the CPU holder 4. When threading the threaded shank 51 of the screw 5 into the screw hole 311 of the heat sink fastener 3 and the locating hole 22 of the heat sink 2, the heat sink fastener 3, the arms 32 of the heat sink fastener 3 are forced to pull the hooks 42 of the heat sink 4 upwards, keeping the flat bottom contact face 21 of the heat sink 2 in close contact with the CPU 41. Furthermore, because the arms 32 of the heat sink fastener 3 are respectively stopped between the respectively pairs of parallel ribs 24, the heat sink fastener 3 is prohibited to displacement relative to the heat sink 2 and the CPU holder 4.

Figure 5:
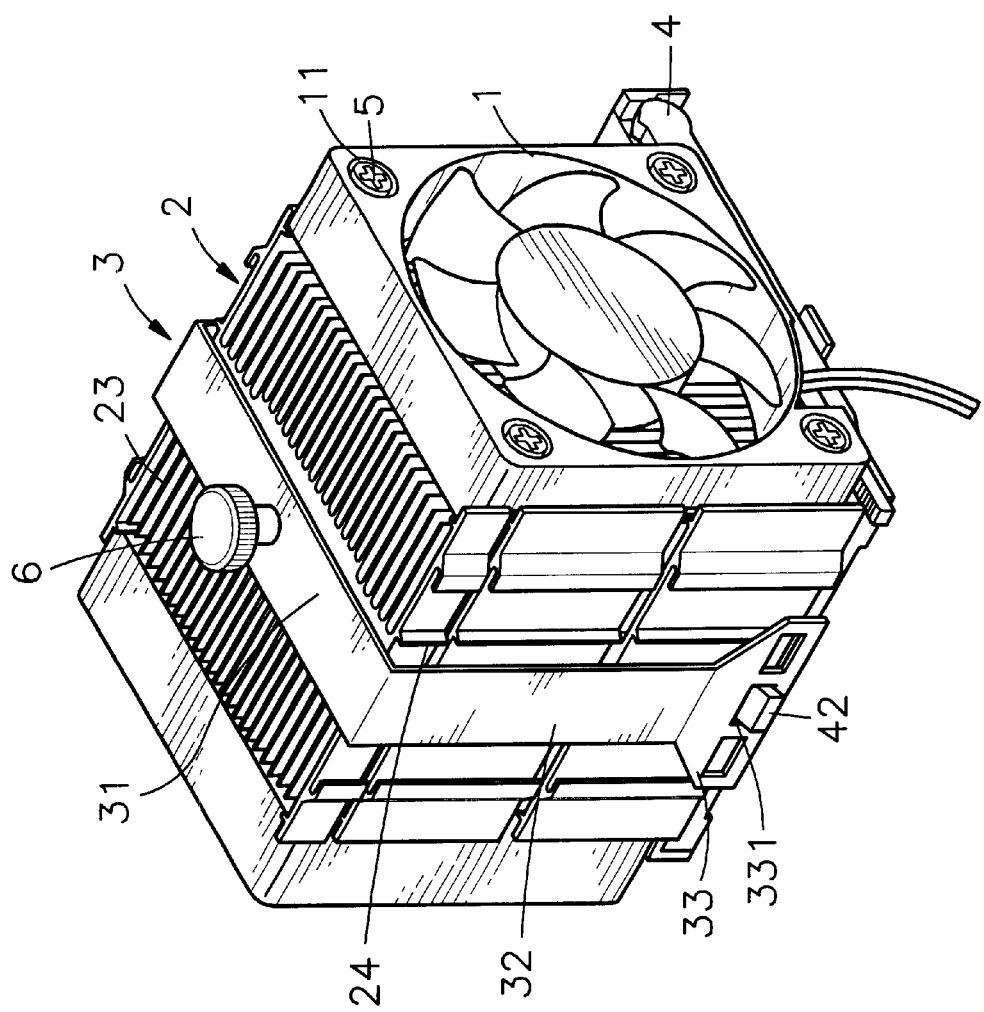
FIG. 5 is a perspective view of an alternate form of the present invention.
Figure 6:
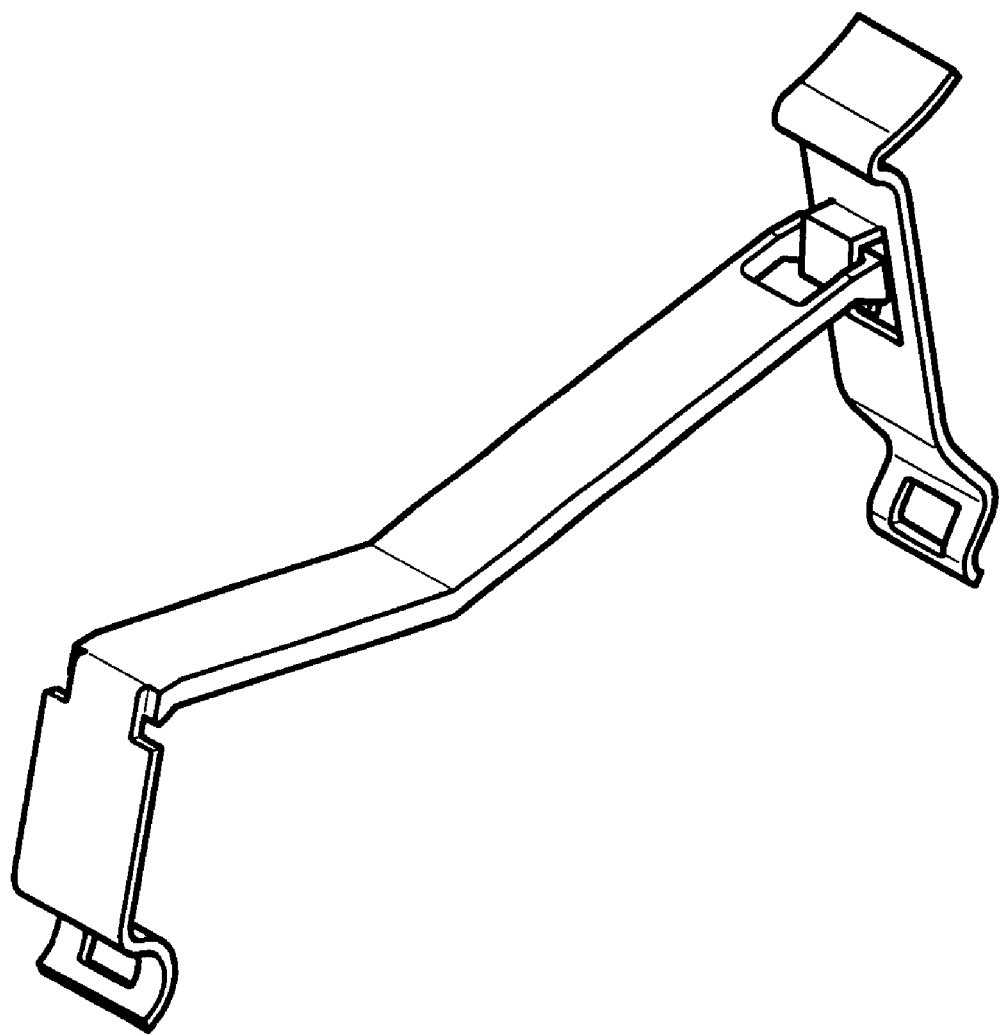
FIG. 6 is an elevational view of a heat sink fastener according to the prior art.

FIG. 5 shows an alternate form of the present invention. According to this alternate form, a hand screw 6 is used to fasten the heat sink fastener 3 to the heat sink 2 by hand.

A prototype of CPU cooling structure has been constructed with the features of the annexed drawings of FIGS. 1–5. The CPU cooling structure functions smoothly to provide all of the features discussed earlier.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A CPU cooling structure comprising a CPU holder holding a CPU, said CPU holder comprising a plurality of hooks respectively disposed at front and back sides thereof, a heat sink mounted on said CPU holder and disposed in contact with the CPU in said CPU holder for dissipating heat from the CPU, said heat sink having a top side, a bottom side, a front side, a back side, and two opposite lateral sides, two fans respectively fixedly fastened to two opposite lateral sides of said heat sink, and a heat sink fastener mounted on said heat sink and hooked on the hooks of said CPU holder to secure said heat sink and said CPU holder together, wherein said heat sink fastener comprises a narrow, horizontally extended, flat base attached to the top side of said heat sink, said flat base having a center screw hole, a tie screw mounted in the center screw hole of said flat base and fastened to said heat sink to secure said flat base to said heat sink, two arms perpendicularly downwardly extended from the two distal ends of said flat base and respectively attached to the front and back sides of said heat sink, and two coupling end pieces respectively extended from the ends of said arms remote from said flat base and hooked on the hooks of said CPU holder, said coupling end pieces each having a plurality of retaining holes adapted for hooking on the hooks of said CPU holder.

2. The CPU cooling structure as claimed in claim 1, wherein said heat sink has a top center locating hole disposed in the center of the top side thereof and adapted to receive said tie screw.

3. The CPU cooling structure as claimed in claim 1, wherein said tie screw is a hand screw.

\* \* \* \* \*